United States Patent
Song et al.

[19]

[11] Patent Number: 6,121,797

[45] Date of Patent: Sep. 19, 2000

[54] ENERGY ECONOMIZED PASS-TRANSISTOR LOGIC CIRCUIT AND FULL ADDER USING THE SAME

[75] Inventors: Min-Kyu Song, Seoul; Geun-Soon Kang, Kyunggi-do; Seong-Won Kim; Eu-Ro Joe, both of Seoul, all of Rep. of Korea

[73] Assignee: Samsung Electronics Co., Ltd., Rep. of Korea

[21] Appl. No.: 09/117,602

[22] PCT Filed: Jan. 30, 1997

[86] PCT No.: PCT/KR97/00018

§ 371 Date: Feb. 9, 1999

§ 102(e) Date: Feb. 9, 1999

[87] PCT Pub. No.: WO97/28604

PCT Pub. Date: Aug. 7, 1997

[30] Foreign Application Priority Data

Feb. 1, 1996 [KR] Rep. of Korea .................. 96/2431

[51] Int. Cl.⁷ .................................................. H03K 19/20
[52] U.S. Cl. ................................... 326/113; 326/119
[58] Field of Search .................... 326/113, 112, 326/119, 121, 26, 27

[56] References Cited

U.S. PATENT DOCUMENTS

| | | | |
|---|---|---|---|
| 4,541,067 | 9/1985 | Whitaker | 364/716 |
| 4,566,064 | 1/1986 | Whitaker | 364/300 |
| 4,595,845 | 6/1986 | Briggs | 326/113 |
| 4,622,648 | 11/1986 | Whitaker | 364/715 |
| 5,126,596 | 6/1992 | Millman | 307/451 |
| 5,151,875 | 9/1992 | Sato | 364/784 |
| 5,568,069 | 10/1996 | Chow | 326/113 |
| 5,777,491 | 7/1998 | Hwang et al. | 326/113 |
| 5,808,483 | 9/1998 | Sako | 326/113 |

OTHER PUBLICATIONS

Yano et al., "*Lean Integration: Achieving a Quantum Leap in Performance and Cost of Logic LSIs*", IEEE 1994 Custom Integrated Circuits Conference, May 1–4, 1994, pp. 603–606.

Parameswar et al., "*A High Speed, Low Power, Swing Restored Pass–Transistor logic Based Multiply and Accumulate Circuit for Multimedia Applications*", IEEE 1994 Custom Integrated Circuits Conference, May 1–4, 1994, pp. 278–281.

*Primary Examiner*—Michael Tokar
*Assistant Examiner*—James H. Cho
*Attorney, Agent, or Firm*—Myers Bigel Sibley & Sajovec

[57] ABSTRACT

Disclosed is an energy economized pass-transistor logic having a level restoration circuit (50) free from leakage and a full adder using the same. The logic comprises a functional block (10) having a plurality of n type FETs (M1 . . . M4), for performing at least one logical function of inputs (12, 14, 16, 18) to generate two complementary signals (20, 22), the complementary signals (20, 22) being a weak high level signal and a strong low level signal; and a level restoration block (50) having first and second CMOS inverters (52, 54), for restoring the weak high level signal to a strong or full high level signal and preventing a leakage current flowing through one of the first and the second CMOS inverters (52, 54) where the weak high level is applied.

17 Claims, 5 Drawing Sheets

ENERGY ECONOMIZED PASS-TRANSISTOR LOGIC CIRCUIT AND FULL ADDER USING THE SAME

TECHNICAL FIELD

The present invention relates to a semiconductor logic circuit, and more particularly to an energy economized pass-transistor logic having a level restoration circuit free from leakage and a full adder using the same.

BACKGROUND ART

In many digital applications, CMOS (Complementary MOS) static logic circuits have been used which have inherently lower power with higher performance than other NMOS (N-channel Metal Oxide Semiconductor) or PMOS (P-channel Metal Oxide Semiconductor) circuits. However, in case of each CMOS static logic circuit constituted with p-type FET (PFET) and n-type FET (NFET), when the FETs are simultaneously turned on by an input signal, a leakage current flows in the CMOS static logic circuit. For this reason, the CMOS static logic circuit is not suitable for a digital circuit with lower power and high speed operation. In high-speed and low-power application, the conventional CMOS design techniques often impose severe speed and power trade-offs, thereby limiting their design flexibility. This is because the system designers have no choice but to design CMOS circuits having one of the two characteristics, or having balanced characteristics.

Pass-transistor logic (hereinafter, referred to as "PL") circuit comprised of a plurality of n type FETs (NFETs) only, has been proposed as a logic circuit suitable for lower power and high speed operation. This PL circuit carries out the same logic function as a conventional CMOS logic circuit, but the number of its transistors is reduced by half, as compared with the conventional CMOS logic circuit. Therefore, in some instances pass-transistor logics are employed, sparingly, to reduce circuit size without increasing power or losing speed. Introduction of PL circuits to many digital applications can minimize the trade-offs as described above.

As shown in FIG. 1, typical AND/NAND pass-transistor logic circuit 10 is constituted with four NFETs M1 to M4, and has four inputs 12, 14, 16 and 18 and two outputs 20 and 22. Input signal "A" and "/A" of the circuit 10 are applied to the inputs 12 and 14, and another input signal "B" and "/B" thereof to the inputs 16 and 18. Drain of the NFET M1 is connected to the input 12 and gate thereof to the input 16. Source of the NFET M2 is grounded and gate thereof is connected to the input 18. Source of the NFET M1 and drain of the FET M2 are commonly connected to the output 20 of the circuit 10. The NFETs M1 and M2 provide the logical ANDing function of the two inputs "A" and "B", thereby resulting in A•B through the output 20.

Also, the drain of the NFET M3 is connected to a supply voltage $V_{DD}$ and the gate thereof to the input 18 of the circuit 10. Drain of the NFET M4 is connected to the input 14 and gate thereof to the input 16. Sources of the NFETs M3 and M4 are commonly connected to the output 22 of the circuit 10. The NFETs M3 and M4 provide the logical NANDing function of the two inputs "A" and "B", thereby resulting in /A•B through the output 22 of the circuit 10.

In the AND/NAND pass-transistor logic circuit 10 as described above, when both the inputs "A" and "B" are logical "1" or high, the NFETs M1 and M4 are turned on. Thus, A•B=1 and /A•B="0". If both the inputs are logical "0" or low, or when the input "A" is high and the input "B" is low, the NFETs M2 and M3 are turned on. Thus, A•B=0 and /A•B=1. When the input "A" goes low and the input "B" goes high, the NFETs M1 and M4 are turned on, resulting in A•B=0 and /A•B=1.

As stated immediately above, the PL circuit 10 has lower power with higher performance than the CMOS logic circuit. This is because the input signals thereof are simultaneously applied to gates and drains of the NFETs constituting the PL circuit. In the conventional PL circuit 10, however, when the output is "1" or high, voltage level of the output is not increased up to a strong or full high level, e.g., $V_{DD}$, but it is insufficiently increased up to $V_{DD}$-Vt (where Vt is threshold voltage of an NFET). The reduction of the output voltage causes a circuit noise margin to be seriously lowered, resulting in decrease in circuit performance. Accordingly, the conventional PL logic requires a level restoration circuit for restoring the output from an insufficient high level to a $V_{DD}$. This PL logic having a level restoration circuit is disclosed by K. Yano, et al., in Proc. IEEE 1994 CICC, May 1994, pp. 603–606, entitled "Lean Integration: Achieving a Quantum Leap in Performance and Cost of Logic LSIs". As reported in the art, the complementary pass-transistor logic (CPL) circuit is shown in FIG. 2.

As shown in FIG. 2, besides the PL circuit 10 of FIG. 1, the complementary PL (hereinafter, referred to as "CPL") further comprises a level restoration circuit 24. The level restoration circuit 24 consists of two CMOS inverters 26 and 28, and has two outputs 30 and 32. Input of the CMOS inverter 26 is connected to one 20 of the outputs of the PL circuit 10 and input of the CMOS inverter 28 is connected to the other output 32.

Operation of the CPL having the above described configuration will be described hereinafter. For brief description, the outputs A•B and /A•B of the PL circuit 10 are hereinafter called "AND output" and "NAND output", respectively. When the AND output of the PL circuit 10 is low, PFET Qp1 of the CMOS inverter 26 is turned on. Thus, the output 30 has a strong or full high level. Therefore, a system using the CPL circuit has an improved function, as compared with another system without the CPL circuit.

In the CPL circuit of FIG. 2, however, the NAND output of the PL circuit 10 becomes a weak high level, $V_{DD}$-Vt. NFET Qn2 of the inverter 28 is incompletely turned on so that a signal of weak low level is generated from the output 32. Also, since the PFET Qp2 is not completely turned off, a small leakage current flows therethrough. The power consumption of the CPL circuit is large while the operation speed thereof is kept high. A good description on the subject is found in an article entitled "A High Speed, Low Power, Swing Restored Pass-Transistor Logic Based Multiply and Accumulate Circuit for Multimedia Application" by A. Parameswar, et al., in Proc. IEEE 1994 CICC, May 1994, pp. 278–281.

FIG. 3 shows a Swing Restored Pass-Transistor Logic (SRPL) circuit disclosed in the above mentioned article. The SRPL circuit of FIG. 3, like the CPL circuit of FIG. 2, has a level restoration circuit 34 which consist of two CMOS inverters 36 and 38. In the SRPL circuit, the outputs 20 and 22 of the PL circuit 10 are connected to outputs 40 and 42 of the level restoration circuit 34, respectively. Input of one of the two CMOS inverters is connected to output of the other. In detail, the output 40 of the inverter 36 is connected to the input of the inverter 38 and the output 42 of the inverter 38 to the input of the inverter 36. When in the SRPL circuit the AND output of the PL circuit 10 is weak high level ($V_{DD}$-Vt), NAND output signal of strong or full low level is provided from the PL circuit 10 to the level restoration circuit 34. Then, PFET Qp3 of the inverter 36 is completely turned on so that AND output of strong or full high level $V_{DD}$ is generated from the output 40 of the level restoration circuit 34. As a result, PFET Qp4 of the inverter 38 is completely turned off and thereby a leakage current does not flow through the PFET Qp4.

As described immediately above, the SRPL circuit has an excellent level restoration function, but a voltage of high level on the output 40 or 42 is discharged through the PL circuit 10. Since the logic circuit has the above described PL function block in which a plurality of NFETs of multi-stage are serially connected, as in a full adder, it has a longer discharge time. As a result, a delay time is increased.

Additionally, as shown in FIG. 6, the SRPL circuit hardly operates in case that each NFET constituting it is small in size. In FIG. 6, X-axis indicates a size of each NFET constituting the PL circuit 10, i.e., a Width/Length (W/L) ratio, and Y-axis indicates a delay time. "1" on the X-axis depicts an NFET size, W/L=1.7/0.65, and "3" thereon depicts W/L=5.1/0.65. It can be understood from FIG. 6 that each NFET of the SRPL circuit must have three or four times in size than the standard NFET in order to normally operate.

As described above, the SRPL circuit has an excellent level restoration function, but can not be formed with high density logic.

DISCLOSURE OF THE INVENTION

It is therefore an object of the present invention to provide an energy economized pass-transistor logic circuit with a high speed operation.

It is a further object of the present invention to provide an energy economized pass-transistor logic circuit for preventing occurrence of a leakage current flowing in the circuit to which a weak high level signal is applied.

It is another object of the present invention to provide a full adder in which an energy economized pass-transistor logic circuit is implemented.

According to one aspect of the present invention, a pass-transistor logic circuit comprises a functional block having a plurality of n type FETs, for performing at least one logical function of inputs to generate two complementary signals, said complementary signals being a weak high level signal and a strong low level signal; and a level restoration block having first and second CMOS inverters, for restoring the weak high level signal to a strong or full high level signal and preventing a leakage current flowing through one of said first and said second CMOS inverters where said weak high level is applied.

According to a further aspect of the present invention, a pass-transistor logic circuit comprises a functional block having a plurality of n type FETs, for performing a logical function to generate first and second signals, said signals being complementary with each other; a first CMOS inverter for receiving and inverting said first signal; a second CMOS inverter for receiving and inverting said second signal; and means for supplying a supply voltage to one of said first and said second inverters, where a high level signal is applied, in response to a low level signal of said first and said second signals to allow said high level signal to be equal to said supply voltage.

According to another aspect of the present invention, an N-bit full adder including at least one pass-transistor logic circuit, comprises a functional block for performing an adding function of inputs to generate at least two pairs of complementary signals with each other; and a level restoration block for restoring a high level signal of said complementary signals to a strong or fill high level signal.

BRIEF DESCRIPTION OF THE DRAWINGS

This invention may be understood and its objects will become apparent to those skilled in the art by reference to the accompanying drawings as follows.

BEST MODE FOR CARRYING OUT THE INVENTION

Figure 1:
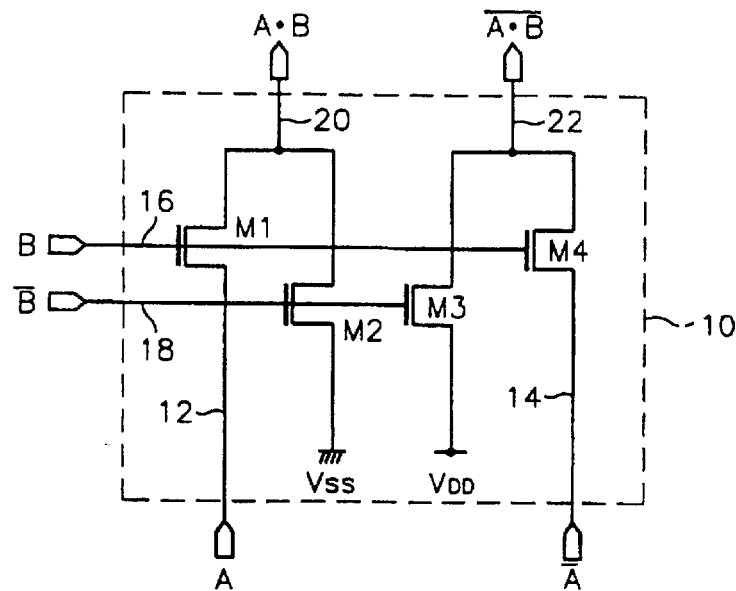
FIG. 1 is a circuit diagram showing a typical pass-transistor logic.
Figure 2:
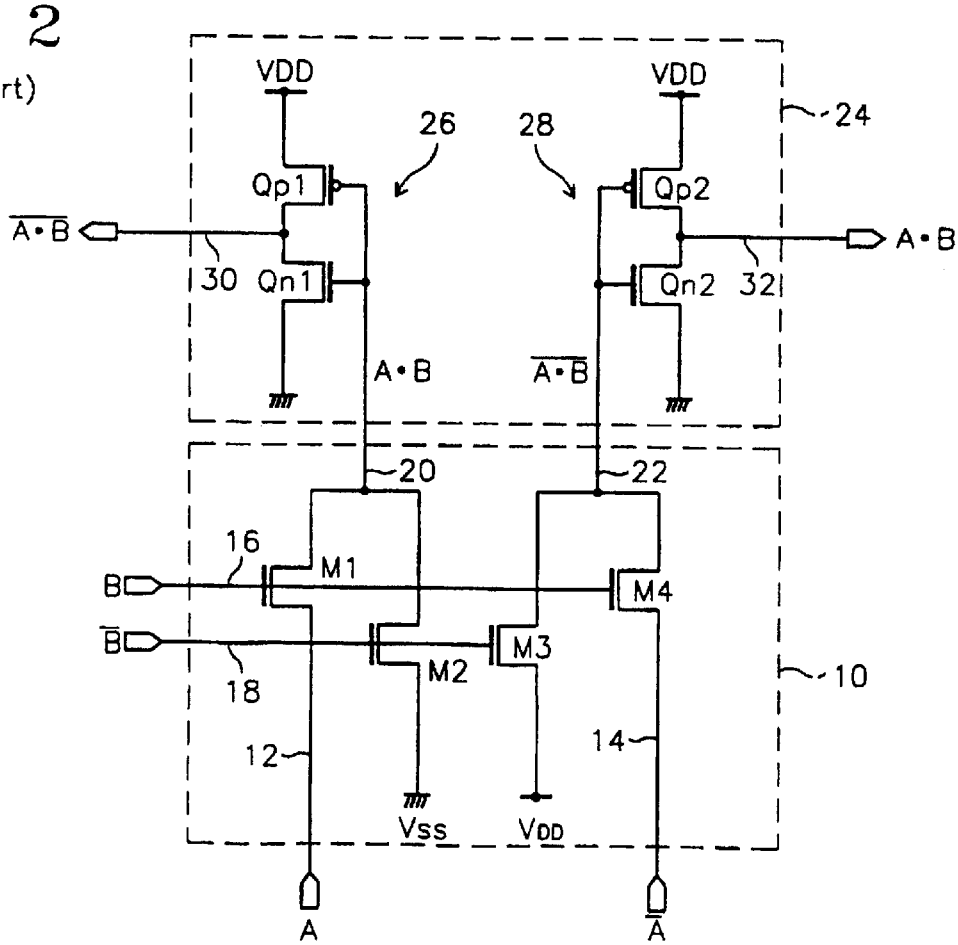
FIG. 2 is a circuit diagram showing an enhanced pass-transistor logic of a prior art.
Figure 4:
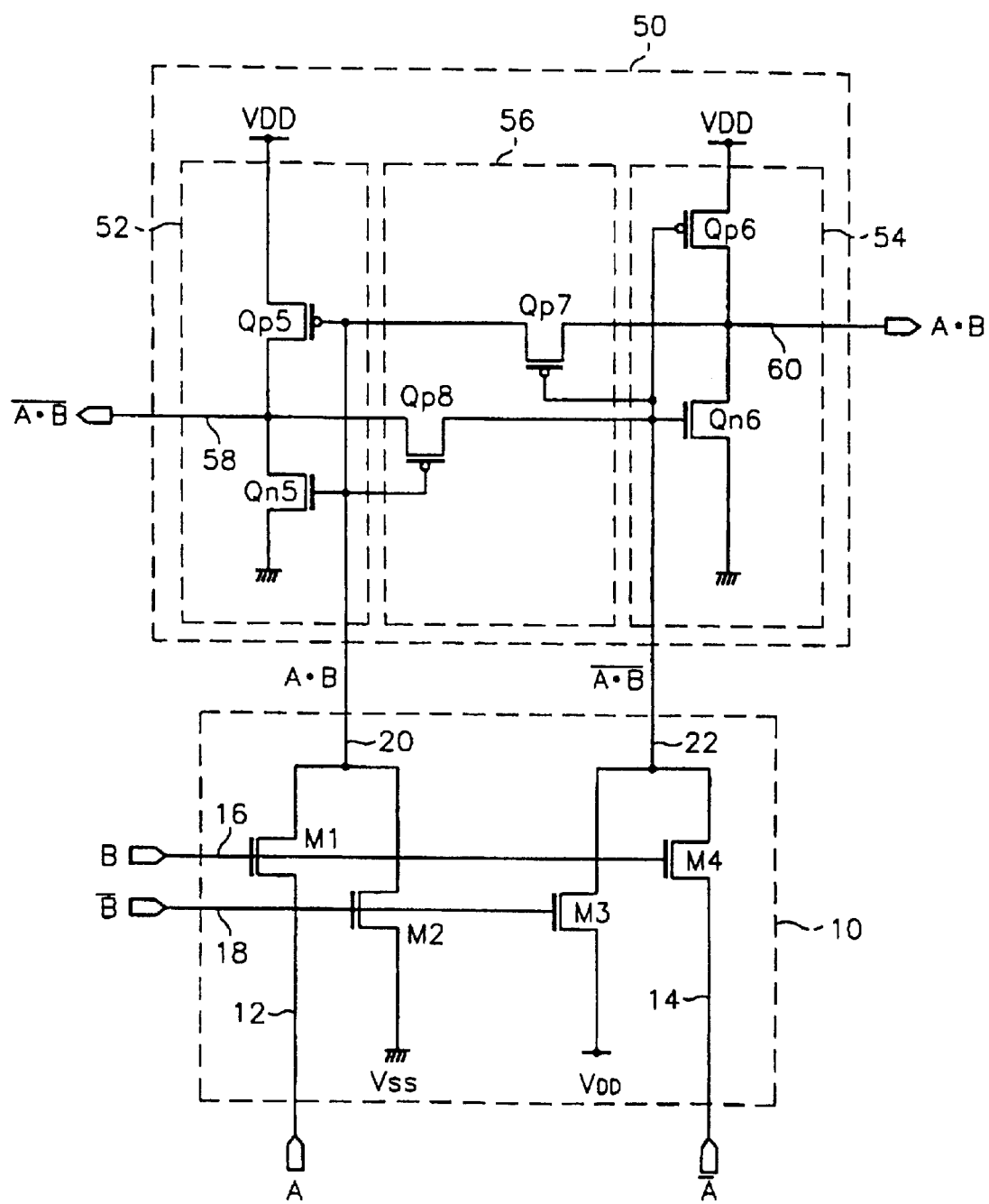
FIG. 4 is a circuit diagram showing a pass-transistor logic according to an embodiment of the present invention.

FIG. 4 illustrates an energy economized pass-transistor logic (hereinafter, referred to as "EEPL") which includes a pass-transistor logic (PL) circuit (or, a functional block) 10 for performing logical ANDing and NANDing functions of two inputs "A" and "B" and a level restoration circuit 50 having energy economized configuration. The PL circuit (or, the functional block) 10 of FIG. 4, like the PL circuit of FIG. 2, is constituted with four n type FETs (NFETs) M1 to M4, and has four inputs 12, 14, 16 and 18 and two outputs 20 and 22. Input signal "A" and "/A" of the circuit 10 are applied to the inputs 12 and 14, and another input signal "B" and "/B" thereof to the inputs 16 and 18. Drain of the NFET M1 is connected to the input 12 and gate thereof to the input 16. Source of the FET M2 is grounded and gate thereof is connected to the input 18. Source of the NFET M1 and drain of the NFET M2 are commonly connected to the output 20 of the circuit 10. The NFETs M1 and M2 provides the logical ANDing function of the two inputs "A" and "B", thereby resulting in A•B through the output 20. Also, the drain of the FET M3 is connected to a supply voltage $V_{DD}$ and the gate thereof to the input 18 of the circuit 10. Drain of the FET M4 is connected to the input 14 and gate thereof to the input 16. Sources of the FETs M3 and M4 are commonly connected to the output 22 of the circuit 10. The FETs M3 and M4 provides the logical NANDing function of the two inputs "A" and "B", thereby resulting in /A•B through the output 22 of the PL circuit 10.

As shown again in FIG. 4, the level restoration circuit 50 is constituted with two CMOS inverters 52 and 54 for inverting outputs of the PL circuit 10, and a regenerative feedback circuit 56 for generating a positive feedback signal in response to the outputs of the PL circuit 10. Input of the inverter 52 is connected to the output 20 of the PL circuit 10 and output thereof is connected to the output 58 of the level restoration circuit 50. Input of the inverter 54 is connected to the output 22 of the PL circuit 10 and output thereof is connected to the output 60 of the level restoration circuit 50.

The regenerative feedback circuit 56 includes two p type FETs (PFET) Qp7 and Qp8. Source-drain channel of the PFET Qp7 is connected between the input of the inverter 52 or the output 20 of the PL circuit 10, and the output of the inverter 54 or the output 60 of the level restoration circuit 50, and gate thereof is connected to the output 22 of the PL circuit 10 or the input of the inverter 54. Source-drain channel of the PFET Qp8 is connected between the input of the inverter 54 or the output 22 of the PL circuit 10, and the output of the inverter 52 or the output 58 of the level restoration circuit 50, and gate thereof is connected to the output 20 of the PL circuit 10, or the input of the inverter 52.

The operation of the EEPL circuit shown in FIG. 4 will be now described. The PL circuit 10 has two complementary outputs m accordance with its operational feature. If one of the two outputs of the PL circuit 10 is, for example, high level, the other must be low level. Assume that the PL circuit 10 outputs A•B of high level on the basis of its ANDing function and /A•B of low level on the basis of its NANDing function. In this case, as described above, the high level from the PL circuit 10 becomes a weak high level $V_{DD}$-Vt (where Vt is threshold voltage of n type FET) and the low level therefrom becomes a strong or full high level $V_{SS}$. The PFET Qp6 is then completely turned on so that the output 60 of the level restoration circuit 50 has a strong or full high level $V_{DD}$. At this time, the PFET Qp7 of the feedback circuit 56 is also turned on so that the input of the inverter 52 goes from the weak high level $V_{DD}$-Vt to the strong or full high level $V_{DD}$ As a result, the PFET Qp5 of the inverter 52 is completely turned off by the strong or full high level increased thus so that no leakage current flows through the PFET Qp5. The NFET Qn5 of the inverter 52 is also completely turned on by the strong or full high level increased thus. Therefore, a strong or full low level is generated through the output 58 of the level restoration circuit 50.

On the contrary, when the PL circuit 10 outputs A•B of low level on the basis of its ANDing function and /A•B of weak high level $V_{DD}$-Vt on the basis of its NANDing function, the PFET Qp5 is then completely turned on so that the output 58 of the level restoration circuit 50 has a strong or full high level $V_{DD}$. At this time, the PFET Qp8 of the feedback circuit 56 is also turned on so that the input of the inverter 54 goes from the weak high level $V_{DD}$-Vt to the strong or full high level $V_{DD}$. As a result, the PFET Qp6 of the inverter 54 is completely turned off by the strong or full high level increased thus so that no leakage current flows through the PFET Qp6. The NFET Qn6 of the inverter 54 is also completely turned on by the strong or full high level increased thus. Therefore, a strong or full low level is generated through the output 60 of the level restoration circuit 50.

As described immediately above, even though one of the outputs of the PL circuit 10 has a weak high level, a positive feedback signal from the level restoration circuit 50 is provided to the input of the inverter to which the weak high level is applied and thus the weak high level goes a strong or full high level. Accordingly, no leakage current flows through the inverter and thereby a strong or full high level output can be obtained from the EEPL.

Figure 3:
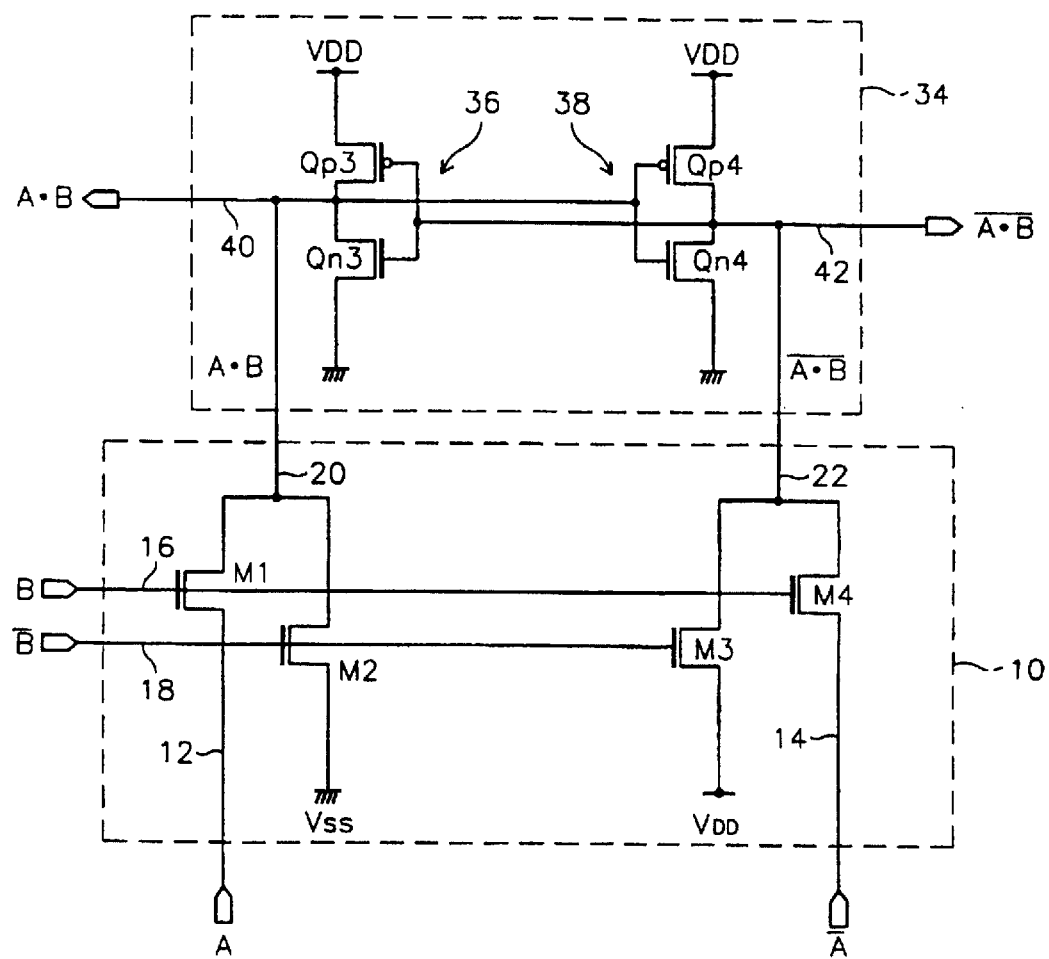
FIG. 3 is a circuit diagram showing an enhanced pass-transistor logic of another prior art.
Figure 6:
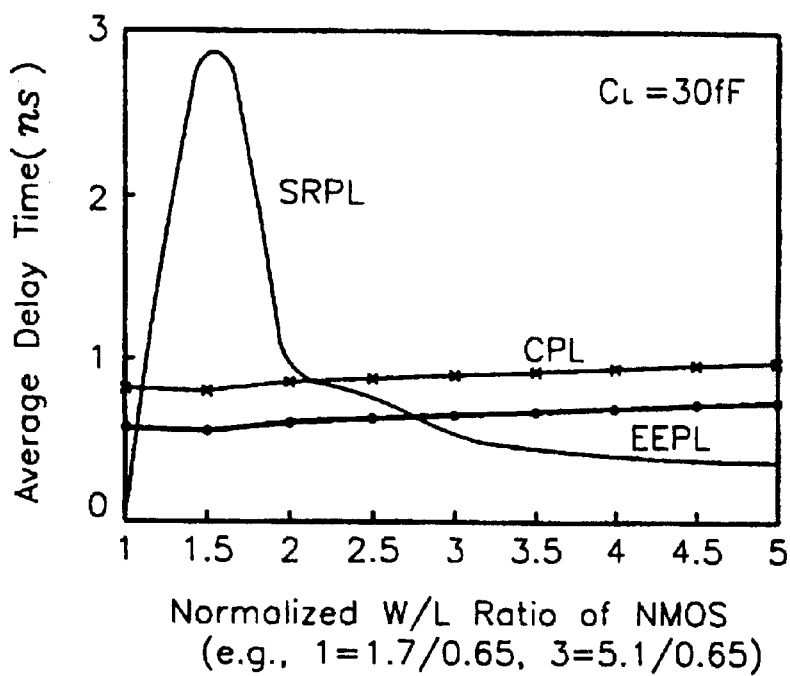
FIG. 6 is a graph showing an average delay with respect to a normalized width/length ratio of the NMOS device so as to explain the characteristics of the pass-transistor logic circuits of the prior art and the present invention.
Figure 7:
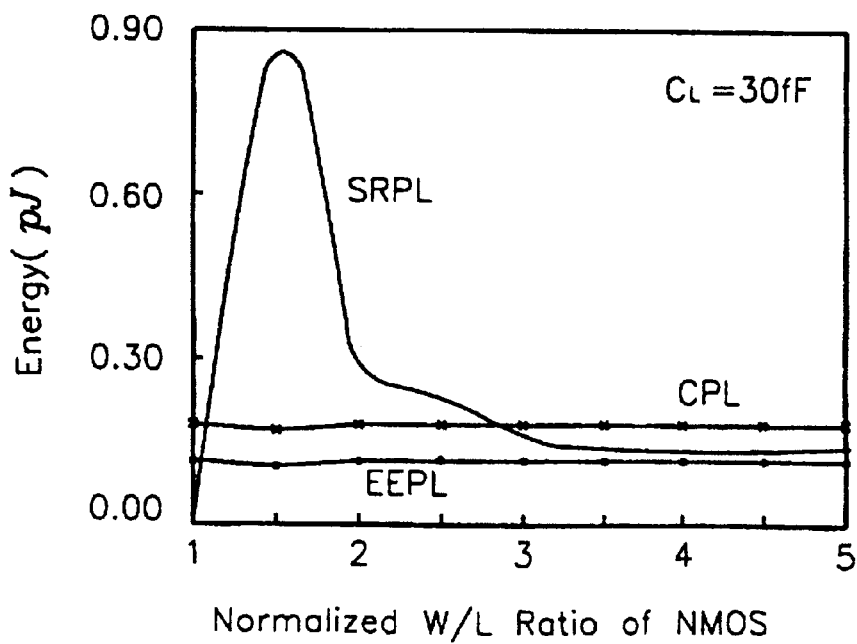
FIG. 7 is a graph showing an energy with respect to a normalized width/length ratio of the NMOS device so as to explain the characteristics of the pass-transistor logic circuits of the prior art and the present invention.

As compared with the CPL of FIG. 2, since, besides the two inverters 52 and 54, the level restoration circuit 50 in the EEPL of the present invention further includes two PFETs constituting the regenerative feedback circuit 56, it is further increased area in chip area. However, since the PFETs in the EEPL function as switching elements, each size of the PFETs can be minimized. Increase of chip area of the additional FETs in the EEPL can be neglected. The EEPL stably operates regardless of the size of FETs, as compared with the SRPL circuit of FIG. 3. Therefore, the EEPL circuit can be designed with a further reduced chip size, as compared with the SRPL circuit. As shown in FIGS. 6 and 7, the EEPL circuit has a lower power with high speed operation, as compared with the conventional circuits.

Figure 5:
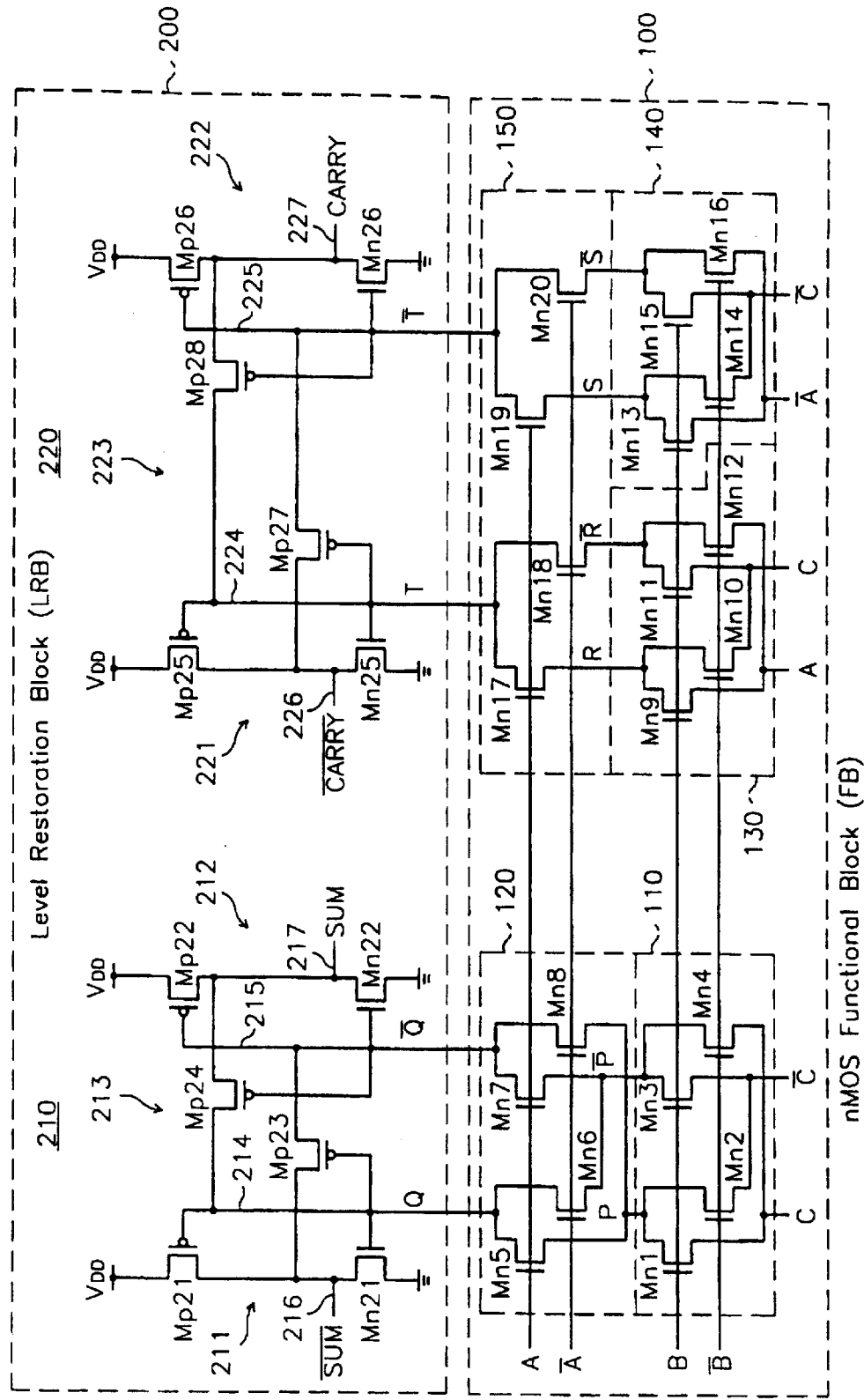
FIG. 5 shows a full adder in which the pass-transistor logic of the present invention can be implemented.

FIG. 5 shows a 1-bit full adder in which the EEPL of the present invention is implemented. The 1-bit full adder includes two blocks, one of which is a function block 100 for performing an adding function of inputs, and the other of which is a level restoration block 200 for restoring a weak high level signal from the function block 100 to a strong or full high level signal. The function block 100 performs an adding function of three bit inputs "A", "B" and "C" and outputs a sum signal Q, a carry signal T and complementary signals /Q and /T. Herein, the input "A" is a most significant bit (MSB) and the input "C" is a least significant bit (LSB).

The function block 100 is constituted with five PL circuits 110, 120, 130, 140 and 150. Each of the PL circuits includes four NFETs. The PL circuit 110 has NFETs Mn1–Mn4. Drain of the NFET Mn1 receives the LSB "C" and drain of the NFET Mn2 receives the complementary signal "/C" of the LSB "C". Gates of the NFETs Mn1 and Mn2 receive the next bit signal "B" and the complementary signal "/B" respectively and sources thereof are connected with each other. Drain of the NFET Mn3 receives the signal "/C" and drain of the NFET Mn4 receives the signal "C". Gates of the NFETs Mn3 and Mn4 receive the bit signal "B" and the complementary signal "/B" respectively and sources thereof are connected with each other. From the PL circuit 110, a partial sum signal "P" and the complementary signal "/P" thereof are generated.

The PL circuit 120 includes NFETs Mn5–Mn8. Drain of the NFET Mn5 receives the partial sum signal "P" and drain of the NFET Mn6 receives the signal "/P". Gates of the NFETs Mn5 and Mn6 receive the MSB signal "A" and the complementary signal "/A" respectively and sources thereof are connected with each other. Drain of the NFET Mn7 receives the signal "/P" and drain of the NFET Mn8 receives the signal "P". Gates of the NFETs Mn7 and Mn8 receive the bit signal "A" and the complementary signal "/A" respectively and sources thereof are connected with each other. Sum signal "Q" and complementary signal "/Q" thereof are generated from the PL circuit 120 and provided to a first level restoration circuit 210 of the bock 200.

The PL circuit 130 has NFETs Mn9–Mn12. Drain of the NFET Mn9 receives the MSB "A" and drain of the NFET Mn10 receives the LSB "C". Gates of the NFETs Mn9 and Mn10 receive the next bit signal "B" and the complementary signal "/B" thereof respectively and sources thereof are connected with each other. Drain of the NFET Mn11 receives the LSB "C" and drain of the NFET Mn12 receives the MSB "A". Gates of the NFETs Mn11 and Mn12 receive the bit signal "B" and the complementary signal "/B" respectively and sources thereof are connected with each other. From the PL circuit 130, a partial sum signal "R" and the complementary signal "/R" thereof are generated.

The PL circuit 140 includes NFETs Mn13–Mn14. Drain of the NFET Mn13 receives the signal "A" and drain of the NFET Mn14 receives the signal "/C". Gates of the NFETs Mn13 and Mn14 receive the signal "B" and the complementary signal "/B" respectively and sources thereof are connected with each other. Drain of the NFET Mn15 receives the signal "/C" and drain of the NFET Mn16 receives the signal "/A". Gates of the NFETs Mn15 and Mn16 receive the bit signal "B" and the complementary signal "/B" respectively and sources thereof are connected with each other. From the PL circuit 140, a partial sum signal "S" and the complementary signal "/S" are generated.

The PL circuit 140 includes NFETs Mn13–Mn20. Drain of the NFET Mn17 receives the partial sum signal "R" from the PL circuit 130 and drain of the NFET Mn18 receives the complementary signal "/R" of the partial sum signal "R". Gates of the NFETs Mn17 and Mn18 receive the signal "A" and the complementary signal "/A" respectively and sources thereof are connected with each other. Drain of the NFET Mn19 receives the partial sum signal "S" from the PL circuit 140 and drain of the NFET Mn20 receives the signal "/S" of the partial sum signal "S". Gates of the NFETs Mn19 and Mn20 receive the signal "A" and the complementary signal "/A" thereof respectively and sources thereof are connected with each other. Carry signal "T" and complementary signal "/T" thereof are generated from the PL circuit 150 and provided to a second level restoration circuit 220 of the block 200.

Referring again to FIG. 5, each of the level restoration circuits 210 and 220 includes two CMOS inverters 211 and 212, or 221 and 222, two inputs 214 and 215, or 224 and 225, and two outputs 216 and 217, or 226 and 227. In the circuit 210, the input 214 of the inverter 211 is commonly connected to the source contacts of the NFETs Mn5 and Mn6 of the PL circuit 120. From the output 216 of the inverter 211, the complementary signal /SUM of a sum signal SUM is generated. The input 215 of the inverter 212 is commonly connected to the source contacts of the NFETs Mn7 and Mn8 of the PL circuit 120. From the output 217 of the inverter 212, the sum signal SUM is generated. The regenerative feedback circuit 213 includes two PFETs Mp23 and Mp24. Source-drain channel of the PFET Mp23 is connected between the input 215 of the inverter 212 and the output 216 of the inverter 211, and gate thereof is connected to the input 214 of the inverter 211. Source-drain channel of the PFET Mp24 is connected between the input 214 of the inverter 211 and the output 217 of the inverter 212, and gate thereof is connected to the input 215 of the inverter 212.

Also in the level restoration circuit 220, the input 224 of the inverter 221 is commonly connected to the source contacts of the NFETs Mn17 and Mn18 of the PL circuit 150. From the output 226 of the inverter 221, the complementary signal /CARRY of a carry signal CARRY is generated. The input 225 of the inverter 222 is commonly connected to the source contacts of the NFETs Mn19 and Mn20 of the PL circuit 150. From the output 227 of the inverter 222, the carry signal CARRY is generated. The regenerative feedback circuit 223 includes two PFETs Mp27 and Mp28. Source-drain channel of the PFET Mp27 is connected between the input 225 of the inverter 222 and the output 226 of the inverter 221, and gate thereof is connected to the input 224 of the inverter 221. Source-drain channel of the PFET Mp28 is connected between the input 224 of the inverter 221 and the output 227 of the inverter 222, and gate thereof is connected to the input 225 of he inverter 222.

The operation of the 1-bit full adder shown in FIG. 5 will be now described. The PL circuit 110 of the function block 100 receives low-order bit signals "B" and "C" and the complementary signals "/B" and "/C" and performs the adding function of the input signals to generate a partial sum signal "P" and a complementary signal "/P" thereof. When the partial sum signals "P" and "/P" from the PL circuit 110 are added with the MSB signals "A" and "/A" by means of the PL circuit 120, the results are sum signals Q and /Q from the PL circuit 120. These sum signals Q and /Q are provided to the inputs 214 and 215 of the inverters 211 and 212 of the level restoration circuit 210 respectively. One of the sum signals Q and /Q then is a weak high level ($V_{DD}$-Vt). The weak high level is changed to a strong or full high level by the level restoration circuit 210. Finally, from the level restoration circuit 210 a sum signal SUM of strong or full high level and a complementary signal /SUM thereof are generated.

Also, the PL circuit 130 receives the input signals "A", "B", "C" and "B" to generate a partial sum signal R and a complementary signal /R thereof, and the PL circuit 140 receives the input signals "B", "/A", "/B" and "/C" to generate a partial sum signal S and a complementary signal /S thereof. The partial sum signals "R", "/R", "S" and "/R" from the PL circuits 130 and 140 are added with the MSB signals "A" and "/A" by means of the PL circuit 150. The results are a carry signal "T" and a complementary signal "/T" thereof from the PL circuit 150. The carry signals "T" and "/T" are provided to the level restoration circuit 220. One of the carry signals CARRY and /CARRY then is a weak high level ($V_{DD}$-Vt). The weak high level is changed to a strong or full high level by the level restoration circuit 220. Finally, from the level restoration circuit 220 a carry signal CARRY of strong or full high level and a complementary signal /CARRY thereof are generated. It can be understood that n-bit full adder includes N number of 1-bit full adders shown in FIG. 5 are arranged regularly. Following table shows the energy consumption characteristics of full adders using the conventional PL or the EEPL of the present invention. It is assumed that each full adder is fabricated by a well-known 0.6 μm CMOS technique in the art, a supply voltage $V_{DD}$ thereof is equal to 3.3 Volts and a load capacitance $C_L$ is 30 fF. Also assumed that, in the inverters for level restoration of each 1-bit full adder, each size of PFETs is W/L=5.4/0.7 and each size of NFETs is W/L=1.7/0.6.

TABLE

|  | the number of transistors | relative chip area | delay (ns) | power (μW/100 MHz) | power consumption (pJ) | relative energy consumption | area energy consumption |
|---|---|---|---|---|---|---|---|
| CPL (m = 1) | 28 | 1 | 1.28 | 148.4 | 0.19 | 1 | 1 |
| SRPL (m = 1) | 28 | 2.19 | 0.89 | 123.6 | 0.11 | 0.40 | 0.87 |
| EEPL (m = 1) | 32 | 1.15 | 1.12 | 89.3 | 0.10 | 0.46 | 0.52 |

FIGS. 6 and 7 are graphs showing an average delay with respect to a normalized W/L ratio of the NMOS device and an energy with respect to a normalized W/L ratio of the NMOS device so as to explain the characteristics of the pass-transistor logic circuits of the prior art and the present invention.

As can be seen from FIG. 7, the conventional SRPL circuit has a lower energy consumption as each NFET of its PL circuit is increased in size. The EEPL circuit of the present invention, however, has an energy consumption regardless of NFET size. Therefore, an energy consumption of the EEPL according to the present invention can be considerably reduced as compared with that of the conventional SRPL or CPL circuit.

What is claimed is:

1. A pass-transistor logic circuit comprising:
    a functional block including a plurality of n type FETs that perform at least one logical function of inputs to generate two complementary signals, said complementary signals being a weak high level signal and a strong low level signal; and
    a level restoration block including first and second CMOS inverters that restore the weak high level signal to a strong high level signal and a circuit that prevents leakage current from flowing through one of said first and said second CMOS inverters to which said weak high level is applied by transferring an output of the other of said CMOS inverters, to which said strong low level signal is applied, to the one of said CMOS inverters.

2. The pass-transistor logic circuit according to claim 1, wherein said circuit comprises two switching devices that are conductive in response to said strong low level signal, to change said weak high level signal to said strong high level signal.

3. The pass-transistor logic circuit according to claim 2, wherein each of said switching devices comprises a p type FET.

4. The pass-transistor logic circuit according to claim 1, wherein said circuit comprises a first FET having a first gate that receives one of said complementary signals and a first source-drain channel connected between said first and said second CMOS inverters, and a second FET having a second gate that receives the other of said complementary signals and a second source-drain channel connected between said first and said second CMOS inverters.

5. The pass-transistor logic circuit according to claim 4, wherein each of said first and said second FETs is a p type FET.

6. A pass-transistor logic circuit comprising:
    a functional block including a plurality of n type FETs that perform a logical function to generate first and second signals, said signals being complementary with each other;
    a first CMOS inverter that receives and inverts said first signal;
    a second CMOS inverter that receives and inverts said second signal; and
    means for supplying a supply voltage to one of said first and said second CMOS inverters to which a high level signal is applied, in response to a low level signal of said first and said second signals, to allow said high level signal to be equal to said supply voltage by transferring an output of the other of said first and second CMOS inverters to which a strong low level signal is applied, to the one of said first and second CMOS inverters.

7. The pass-transistor logic circuit according to claim 6, wherein said means comprises two switching devices that become conductive in response to said low level signal, to change said high level signal to said supply voltage.

8. The pass-transistor logic circuit according to claim 7, wherein each of said switching devices comprises a p type FET.

9. The pass-transistor logic circuit according to claim 6, wherein said means comprises a first FET having a first gate that receives one of said complementary signals and a first source-drain channel connected between said first and said second CMOS inverters, and a second FET having a second gate that receives the other of said complementary signals and a second source-drain channel connected between said first and said second CMOS inverters.

10. The pass-transistor logic circuit according to claim 9, wherein each of said first and said second FETs is a p type FET.

11. An N-bit full adder including at least one pass-transistor logic circuit, comprising:
    a functional block that adds inputs to generate at least two pairs of complementary signals; and
    a level restoration block that restores a high level signal of said complementary signals to a strong high level signal and that prevents leakage current from flowing through said level restoration block due to said high level signal, the level restoration block including first and second CMOS inverters that restore a weak high level signal to a strong high level signal and a circuit that prevents leakage current from flowing through one of said first and said second CMOS inverters to which said weak high level is applied by transferring an output of the other of said CMOS inverters, to which said strong low level signal is applied, to the one of said CMOS inverters.

12. The N-bit full adder according to claim 11, wherein said functional block comprises five logical adding circuits, wherein each of the logical adding circuits comprises four n type FETs that perform a logical adding function of input signals.

13. The N-bit full adder according to claim 12, wherein said first and second CMOS inverters invert one of said two pairs of said complementary signals, said level restoration block further including a regenerative feedback circuit that generates a positive feedback signal in response to a low level signal of said complementary signals from said functional block and that provides the positive feedback signal to said one of said first and said second CMOS inverters to which a high level signal is applied.

14. The N-bit full adder according to claim 11, wherein said level restoration block comprises two switching devices that are conductive in response to said low level signal, to change said high level signal to a supply voltage.

15. The N-bit full adder according to claim 14, wherein each of said switching devices comprises a p type FET.

16. The N-bit full adder according to claim 11, wherein level restoration block comprises a first FET having a first gate that receives one of said complementary signals and a first source-drain channel connected between said first and said second CMOS inverters, and a second FET having a second gate that receives the other of said complementary signals and a second source-drain channel connected between said first and said second CMOS inverters.

17. The N-bit full adder according to claim 16, wherein each of said first and said second FETs is a p type FET.

* * * * *

UNITED STATES PATENT AND TRADEMARK OFFICE
CERTIFICATE OF CORRECTION

PATENT NO. : 6,121,797
DATED : September 19, 2000
INVENTOR(S) : Song et al.

It is certified that error appears in the above-identified patent and that said Letters Patent is hereby corrected as shown below:

Column 10, line 41, please delete "12" and substitute – 11 – therefor.

Signed and Sealed this

Eighth Day of May, 2001

Attest:

NICHOLAS P. GODICI

Attesting Officer

Acting Director of the United States Patent and Trademark Office